United States Patent [19]
Robb et al.

[11] Patent Number: 5,276,839
[45] Date of Patent: Jan. 4, 1994

[54] SYSTEM FOR PROGRAMMING EEPROM WITH DATA LOADED IN ROM BY SENDING SWITCH SIGNAL TO ISOLATE EEPROM FROM HOST SYSTEM

[75] Inventors: James R. Robb, Marion, Iowa; David S. Silver, Beaverton, Oreg.

[73] Assignee: United States of America as represented by the Secretary of the Air Force, Washington, D.C.

[21] Appl. No.: 667,619

[22] Filed: Mar. 7, 1991

[51] Int. Cl.$^5$ .......................................... G06F 13/00
[52] U.S. Cl. ........................ 395/425; 364/245.7; 364/260; 364/262.8; 364/DIG. 1; 364/965.81
[58] Field of Search ................ 395/800, 425; 341/144

[56] References Cited

U.S. PATENT DOCUMENTS

| | | | |
|---|---|---|---|
| 4,156,926 | 5/1979 | Hartman | 395/425 |
| 4,382,279 | 5/1983 | Ugon | 395/800 |
| 4,498,151 | 2/1985 | Henry | 395/425 |
| 4,712,190 | 12/1987 | Guglielmi et al. | 395/425 |
| 4,718,037 | 1/1988 | Thaden | 395/800 |
| 4,751,633 | 6/1988 | Henn et al. | 395/575 |
| 4,752,871 | 6/1988 | Sparks et al. | 395/800 |
| 4,794,558 | 12/1988 | Thompson | 395/800 |
| 4,801,923 | 1/1989 | Schwartz et al. | 341/144 |
| 4,807,114 | 2/1989 | Itoh | 395/800 |
| 4,905,140 | 2/1990 | Sakakibara et al. | 395/425 |
| 4,975,832 | 12/1990 | Saito et al. | 395/425 |
| 4,979,172 | 12/1990 | Murase et al. | 371/16.1 |
| 5,016,212 | 5/1991 | Yamaguchi et al. | 395/375 |
| 5,068,823 | 11/1991 | Robinson | 395/500 |
| 5,088,023 | 2/1992 | Nakamura et al. | 395/425 |
| 5,101,490 | 3/1992 | Getson, Jr. et al. | 395/425 |
| 5,133,663 | 7/1992 | Willingham et al. | 434/2 |
| 5,138,548 | 8/1992 | Kienle | 395/425 |
| 5,161,232 | 11/1992 | Beran | 395/800 |

Primary Examiner—Lawrence E. Anderson
Assistant Examiner—Meng-Ai T. An
Attorney, Agent, or Firm—Donald J. Singer; William G. Auton

[57] ABSTRACT

An EEPROM programming circuit is disclosed which provides for the on-board programming of a EEPROM memory using:

a microprocessor, a bootstrap ROM, a UART communications port, and a Eccles-Jordan flip flop switch system. These elements are electrically connected to a host system and the EEPROM by a central data bus. In normal operation, the host system sends a first set of data signals through the circuit to the EEPROM, which produces a set of processed signals. In operation in the programming mode the host system sends a second set of data signals to cause the microprocessor to send a switch signal to the Eccles-Jordan flip flop switch and to the bootstrap ROM. The bootstrap ROM contains the program code that forms the programs that are used to program the EEPROM. The Eccles-Jordan flip flop switch works with the communications port to serve as a means of isolating the EEPROM from the host system and directly connecting to EEPROM is the bootstrap ROM for programming when receiving the switch signal from the microprocessor.

1 Claim, 4 Drawing Sheets

SYSTEM FOR PROGRAMMING EEPROM WITH DATA LOADED IN ROM BY SENDING SWITCH SIGNAL TO ISOLATE EEPROM FROM HOST SYSTEM

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to data processors, and more specifically the invention pertains to an arrangement which provides for the on-board programming of an EEPROM memory.

Most processors use programmable read only memories (PROMs) to store program code. To avoid the necessity of removing the PROMs for programming, it is very desirable to program the PROMs while they are on-board. While electrically erasable PROMs (EEPROMs) have simplified some of the difficulties, adding PROM programming capability usually increases the complexity of the design, adds components, and uses additional board space.

The electrically erasable programmable read only memory (EEPROM) is a field-programmable read only memory in which cells may be erased electrically and each cell may be reprogrammed electrically. The number of times the EEPROM can be reprogrammed (write/erase cycles) ranges from 10 times to $10^6$ times.

Existing systems either add specialized circuitry for on board programming or tend to remove, reprogram, and replace EEPROMs in data processing systems when required by using a separate specialized program system. However, in general, it seems wasteful to have to add specialized circuitry to accommodate programming when there is a powerful processor already present. If the processor could be configured to be not only the main processor running out of the EEPROM, but also an intelligent EEPROM programmer that could load the EEPROM, then the problem of on-board programming would be simplified.

The task of providing a dual function data processing system that performs its main task and can program EEPROM chip elements is alleviated, to some extent, by the systems described in the following U.S. patents, the disclosures of which are incorporated herein by reference:

U.S. Pat. No. 4,156,926 issued to Hartman;
U.S. Pat. No. 4,712,190 issued to Guglielmi et al;
U.S. Pat. No. 4,718,037 issued to Thaden;
U.S. Pat. No. 4,752,871 issued to Sparks et al; and
U.S. Pat. No. 4,794,558 issued to Thompson.

Sparks et al disclose a single chip microcomputer comprising at least two separate and independent EEPROMs on board which may be independently programmed, erased and read. The split EEPROM provides versatility in allowing one part of the EEPROM to be programmed while the program stored in the other part of the EEPROM may be read and utilized.

Thompson is concerned with a single-chip microcomputer with a CPU which has an EEPROM control register loadable under the control of a computer program stored in an external memory. The microcomputer has the capability of utilizing its own CPU to program the EEPROM.

In Thaden a microprocessor system includes an internal memory and further includes an electrically programmable read-only memory for the storage of data and commands which define operations on the data. Guglielmi et al describe a self-timed random access memory circuit designed on a single monolithic integrated circuit chip. In Hartman a PROM programmer programs an array of PROMs mounted on a circuit board.

As discussed by the above-cited references, the provision of data processing systems with built-in systems level EEPROM programming abilities is an ongoing need to which many technical solutions are being applied. The present invention is intended to satisfy that need.

SUMMARY OF THE INVENTION

The present invention includes a data processor system for use with a host system and an EEPROM. In one embodiment of the invention the host system is a TACAN air navigation system that outputs a TACAN clock signal and navigation data as a first set of data signals. The data processor system is able to serve the TACAN system by processing the data, and when necessary is able to program the EEPROM using a UART communications port.

The data processor system of the present invention performs a dual function using: a microprocessor, a boot strap ROM, a UART communications port, and a Eccles-Jordan flip flop switch system. These elements are described below.

The data processing system is electrically connected to the TACAN air navigation system and the EEPROM by a central data bus. In normal operation, the navigation data is received and processed by the data processing system as it interacts with both the TACAN and the EEPROM. The UART of the data processing system provides the usual link to the test equipment. The bootstrap ROM is disabled (except during initialization). In the programming mode, the central data bus is isolated from the data processing system by converting the interface between the data processing system and the central data bus into a windowing function. The microprocessor now operates from the bootstrap ROM. The bootstrap ROM contains the program which converts the microprocessor, UART and window function into an intelligent EEPROM programmer. All data that is to be loaded into or read from the EEPROM is transferred via the UART. (NOTE: The contents of the bootstrap ROM are loaded into the EEPROM. The EEPROM contains the code which is activated by the switch signal from the microprocessor to form the data signals that are used to program the EEPROM. The bootstrap code is generic and fixed. This allows the bootstrap code to be manufactured permanently into the device without regard to the application.)

The advantage of the present invention includes a greater reliability for a system which supports a TACAN air navigation system. More specifically, when an internal EEPROM which requires programming breaks down, maintenance teams can simply replace the damaged EEPROM with a blank EEPROM, and program the new EEPROM via the UART. This ability to program internal elements represents an increased reliability and a reduced amount of "down time" for any data processor system which interacts with any other host system.

It is an object of the present invention to enable a data processor to serve a host system and when required program an EEPROM element.

It is another object of the present invention to increase the reliability of systems by enabling them to program their own internal EEPROM elements.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a system which provides an on-board programming of an electrically erasable PROM (EEPROM). One embodiment of the invention uses a dual function microprocessor which contains a communications port and a built-in systems level EEPROM programmer. It combines the features of a companion processor with the main processor and contains a microprocessor, a communications port, a boot-strap ROM (auxiliary memory), and a dual function interface (straight and window). For additional benefits the ROM contains device BIT routines and the intelligent serial interface allows for easy access of the memory space, I/O space and the internal processor registers. Other generic functions such as RAM, counters, timers, and a programmable baud rate generator for the window can be added.

As described in detail below, the present invention allows a microprocessor (which helps a host system to perform its mission) to serve as a dual function microprocessor. The microprocessor can become an on-board programmer which programs the system EEPROM in addition to its normal function of performing the mission of the host system. Such "host systems" can include navigation systems, radar systems, and any other system which uses a data processor. This is best understood by observing the system of FIG. 1.

Figure 1:
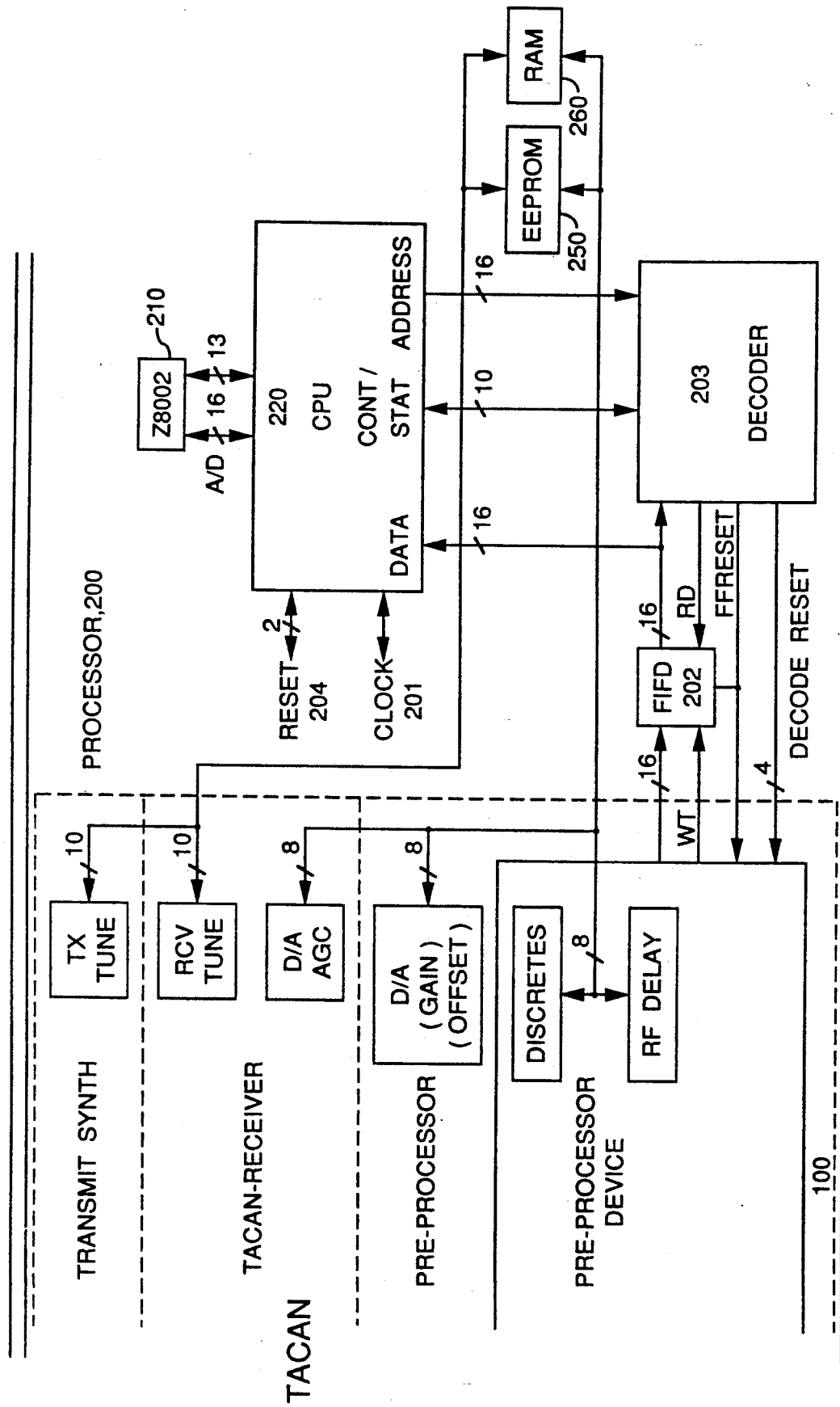
FIG. 1 is a block diagram of a data processor system which serves to process and display TACAN data.

FIG. 1 is a block diagram of a TACAN and data processor interface in which the present invention is used. In FIG. 1, the TACAN system 100 is the "host system", and will be described briefly below.

TACAN refers to the Tactical Air Navigation systems used by aircraft. Commercially-available systems include the SANS-706 manufactured by Sierra Research of Buffalo, N.Y., and to an analog navigation computer such as Model 6340L manufactured by Lear Siegler, Inc. Instrument Division of Grand Rapids, Mich.

TACAN is a polar coordinate navigation system in which a single emission provides both bearing and distance information. Its effective range is 200 nautical miles. Its accuracy is ±0.2 mi in distance and one degree in bearing.

The TACAN ground beacon operates at a frequency of 962-1024 and of 1151-1213 megahertz (MHz=106 cycles per second), where it emits pulse pairs. Each pulse has a duration of about 3½ microseconds, and the time between pulses of a pair is 12 microseconds. Transmission occurs on 1-MHz channels; a total of 126 ground-to-air channels are provided. A total of 2700 pairs of pulses are emitted randomly. In addition, another 900 pairs of pulses are transmitted to serve as directional references. The emitted pulses are radiated by means of a nondirectional antenna around which two cylinders carrying parasitic elements rotate at a speed of 900 rpm. The inner cylinder carries a single parasitic element, whereas the outer carries nine parasitic elements. In space, a cardioid pattern is generated distorted with nine lopes.

The TACAN receiver output consists of pulses having amplitude variations corresponding to a 15 hertz (Hz) wave with a pronounced ninth harmonic. When the 135-Hz harmonic wave is extracted and compared with the pulses marking the 40 degree sectors, a highly precise indication of bearing is obtained; the bearing is ambiguous, however, in that the particular 40 degree sector to which it applies is not known. The extracted 15-Hz signal provides the indication necessary to resolve the ambiguity. Bearing is displayed on a meter which indicates it automatically without ambiguity.

Inputs from the TACAN set 100 include a 28 volt DC power supply voltage, a clock input, a data input, and a DME require input. The navigation computer supplies a +/−6.5 volt reference potential to the high and low side of the range potentiometer. Additionally, the bearing superflag input is utilized to generate the bearing lock signal and is utilized to generate a range lock signal.

Further details of TACAN are not believed to be necessary since, in the context of the present invention, TACAN is just on example of a host system which interacts with a processor 200. More details of such interaction are found in U.S. Pat. No. 4,801,923 issued on Jan. 31, 1989 to Schwartz, the disclosure of which is specifically incorporated by reference.

In the system of FIG. 1, the processor 200 interacts with the TACAN system 100. The processor 200 consists of the EEPROM 250, RAM 260, FIFO 202, DECODER 203, and the data processing system. The data processing system consists of the Z8002 CPU 210 and the CPSU (Central Processor Support Unit) 220. The DECODER 203 provides the specific decodes required to interface the data processing system with the host system. The FIFO 202 is used for buffering and synchronizing the raw TACAN data to the data processing system. The EEPROM 250 and RAM 260 provide code and data memory respectively.

Figure 2:
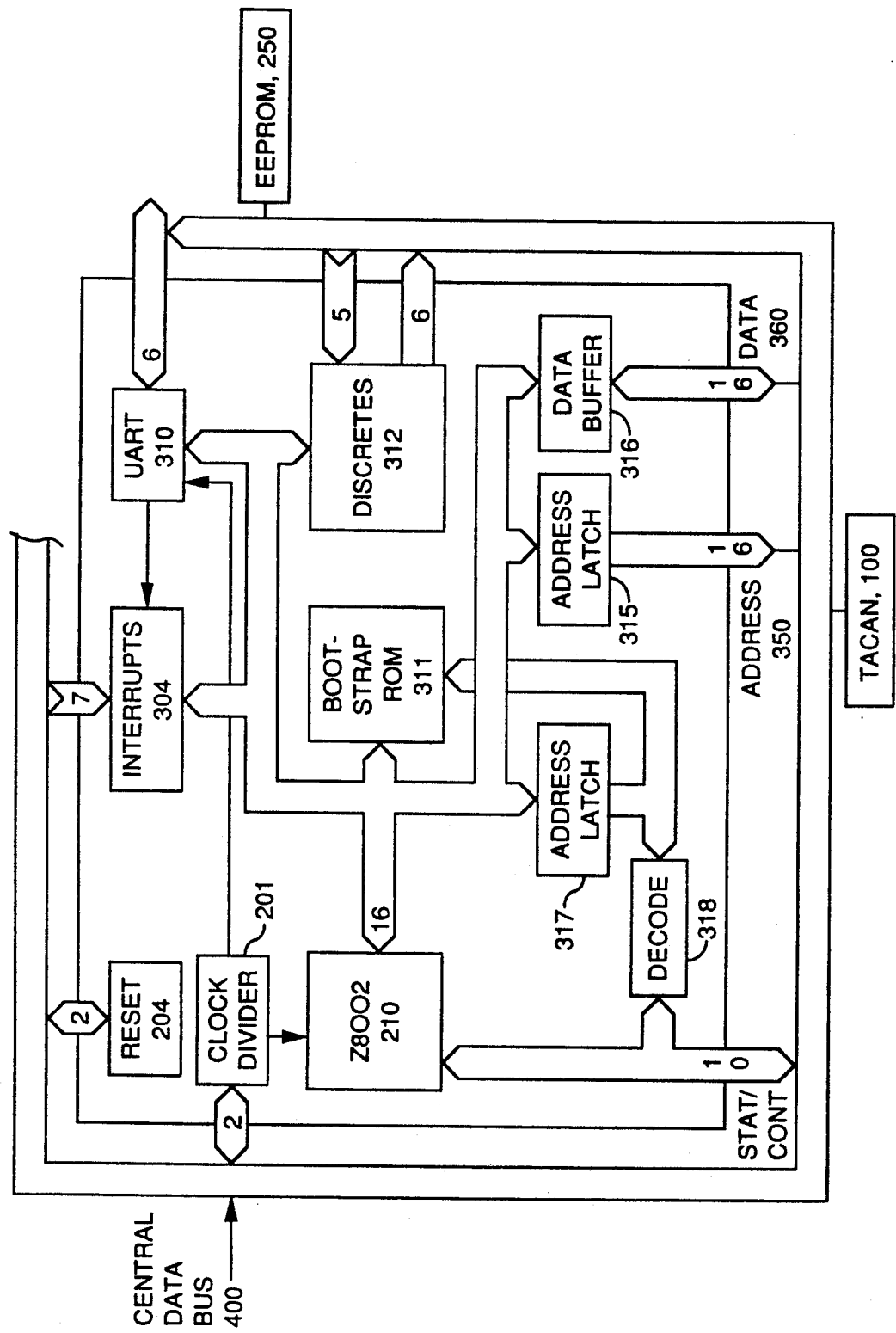
FIG. 2 is a detailed block diagram of the present invention which can replace the data processor system of FIG. 1.

FIG. 2 is a block diagram of the present invention which replaces the data processing system of 210 and 220 with a single device. In FIG. 2, a dual-function processor is accomplished by implementing the interface between the processor and the rest of the system as both a straight through interface for normal operations and a windowing function for programming operations. The programming code resides in an auxiliary memory (boot-strap ROM) 311 that would be invoked while the EEPROM is being reloaded. EEPROM data is supplied via a communications port 310 which many processors already have for communicating with test equipment.

The key elements of FIG. 2 include: the UART communications port 310, the microprocessor unit 210, the boot strap ROM 311, and a dual function interface. The microprocessor unit 210 is a commercially-available device which is connected by a 16 bit data port 360 and a 16 bit address port 350 to a central data bus 400, which allows it to interact with the TACAN host system 100 of FIG. 1. The external clock signal produced by the TACAN 100 is received and divided by the clock divider 201 to produce an internal clock signal for the microprocessor unit 210. More specifically, the TACAN clock signal of 24 MHz is divided by four to produce the internal signal.

The main purpose of the ROM 311 is to contain the program which converts the microprocessor, UART and window function into an intelligent EEPROM programmer. All data that is to be loaded into or read from the EEPROM is transferred via the UART. The bootstrap ROM can also contain initialization test routines for the data processing system.

In a typical programming operation, a message would be sent to the CPU 210 via the UART 310. The message would contain, for example, the command to load a memory location, the address of that location, and the data. The CPU, operating from the code stored in the bootstrap ROM, would first decode that this is memory load. It would then load the address into window function of address latch 315. It would then write the data via an I/O operation through data buffer 316 using the stored window address as the address of the central data bus. This would load the data into the correct location of the EEPROM.

All of the subsystems of the data processing system of FIG. 2 are known in the art. These subsystems are functionally described below.

The reset switch 204 synchronizes incoming asynchronous signals from the TACAN by sending a signal to the microprocessor unit 210 to initialize its interaction with TACAN operations. The reset switch itself is synchronized by the clock divider 201.

The UART 310 is a programmable asynchronous serial port with modem controls. The port operates at 9600 baud. Handshaking is provided by either polling the UART status register or by using the receiver ready condition flag to generate an interrupt. The UART 310 is a commercially-available communications port with four separate modem controls. (Data terminal ready, clear to send, data set ready, and request to send.)

The interrupt controller 304 contains eight interrupts. One comes from the internal UART and the rest are available externally. Interrupts may be triggered via hardware or software.

The decode section 318 provides all the mapping for access to the data processing system functions. This includes the access to the boot-strap ROM 311.

The discrete unit 312 provides input and output discretes to the data processing system. One of the input discretes is dedicated as a mode input. This input is sampled during initialization to determine whether the data processing system should enter the programming mode.

Upon reset, the data processing system is initialized with the bootstrap ROM enabled. The central data bus 400 (address, data, control, etc.) operates normally with the exception of the DS (data strobe) signal. The DS signal is suppressed while the bootstrap ROM is enabled. This arrangement provides monitoring capabilities of the data processing system's internal operations but prevents any external device from responding to a transaction. The ROM contains initialization and self-test routines for the data processing system. Upon completion of these routines, the mode input of the discrete unit 312 is sampled. If the mode pin is in the normal (high) state, the bootstrap ROM is disabled and the DS signal is enabled. All further code fetches will occur from the EEPROM via the central data bus 400. The UART is then used as the AGE port.

If, after completion of the initialization and self-test routines, the mode pin is sampled and it is in the programming (low) state, the data processing system enters the programming mode. The bootstrap ROM (which contains the programming routines) remains enabled, the UART and interrupt devices are initialized, and the central data bus interface is switched to a window function. The DS signal is only generated when a specific I/O location is accessed. The data processing system is now configured as an intelligent EEPROM programmer which communicates with the external test set via the UART. This arrangement allows for EEPROM programming, memory chip fault determination and isolation, and accessibility to any memory or I/O mapped function.

Most of the subsystem units depicted in FIG. 2 are commercially available and well known in the art. Some of the more interesting units are explained further in the block diagram that follow.

Figure 3:
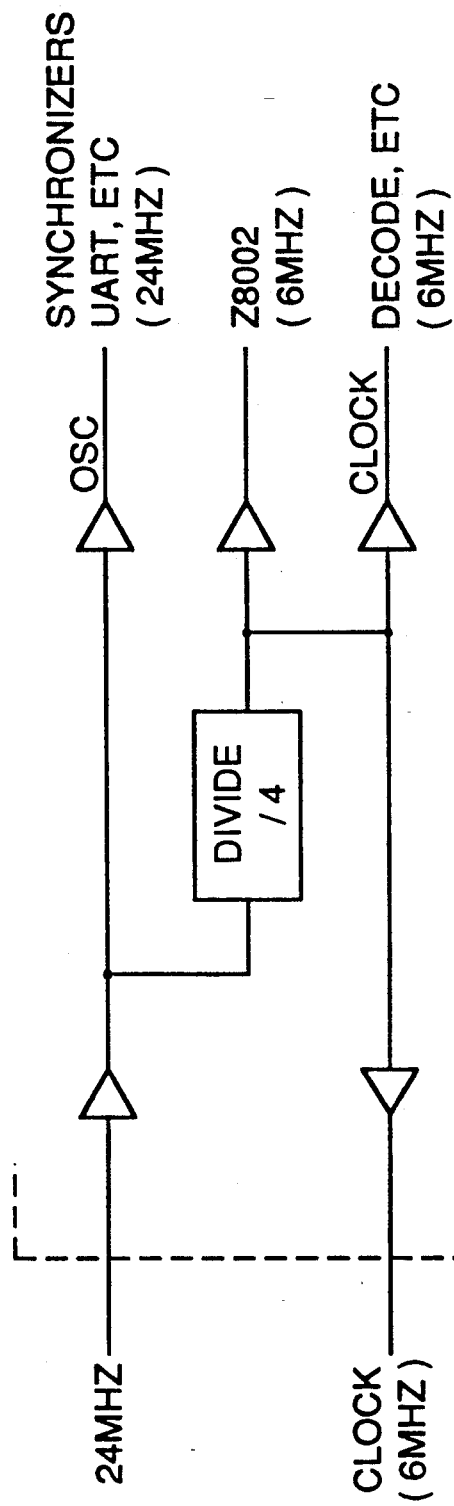
FIG. 3 is a block diagram of the clock divider unit used in FIG. 2.

FIG. 3 is a block diagram of the clock divider unit 201 depicted in FIG. 2. As shown in FIG. 3, it receives a 24 MHz clock signal from the TACAN unit, and divides it by four to output a 6 MHz signal for the microprocessor unit 210 and the Decode unit 318. The purpose of FIG. 3 is to illustrate that the clock divider 201 also conducts the 24 MHz signal without division to the UART 310, where it serves as an oscillator signal.

Figure 4:
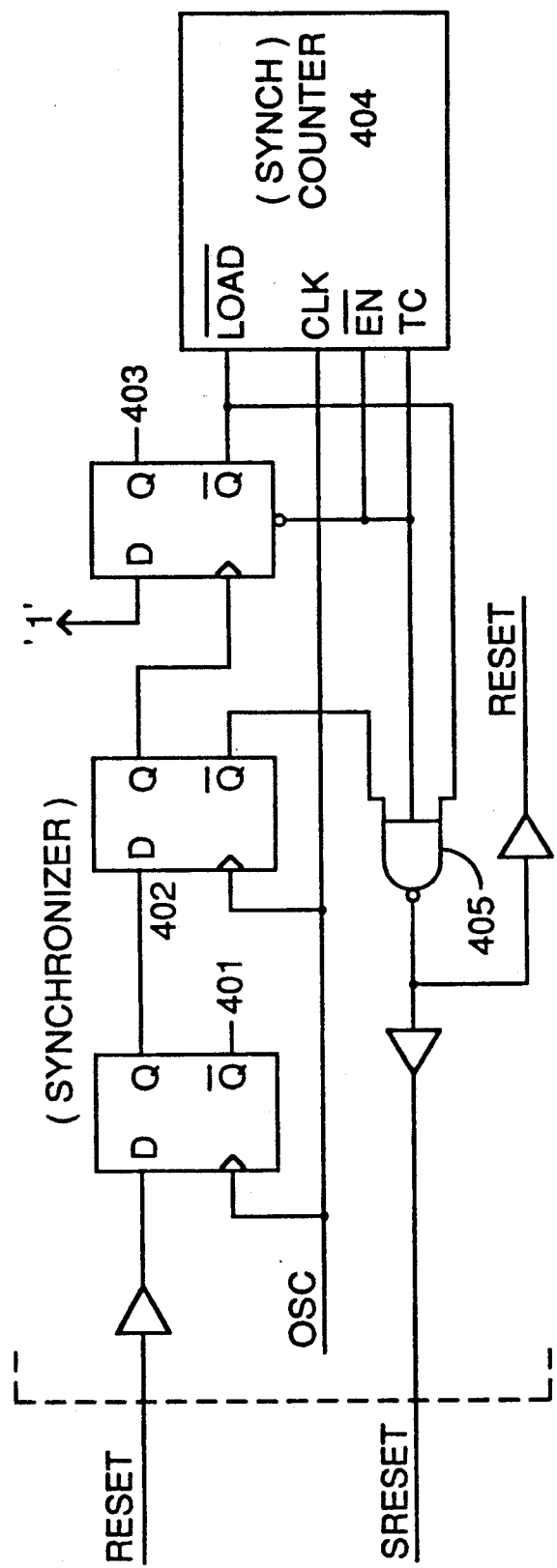
FIG. 4 is an electrical schematic of the Reset unit of FIG. 2.

FIG. 4 is an electrical schematic of the Reset unit 204 of FIG. 2. As shown, it consists of three buffers, three flip flop units 401–403, a counter 404, and a NAND gate 405.

Each flip flop is a conventional bistable multivibrator Eccles-Jordan circuit having two stable states. In one state, the first stage is conducting and the second is cut off. In the other state, the second stage is conducting and the first stage is cut off. A trigger signal changed the circuit according to the state of the data input (D). For counting and scaling purposes, a flip flop can be used to deliver one output pulse for each two input pulses.

Before progressing further, it is important to note that all flip flop circuits are identical conventional Eccles-Jordan circuits which, as depicted in FIG. 3, have: three input terminals D, clock (CLK), and clear (CLR), as well as two output terminals Q and $\overline{Q}$. In all the figures, these terminals are only depicted if they are actually used.

When the flip flop of FIG. 4 is the ONE state, the I side output (Q) is high and the O side output ($\overline{Q}$) is low. When the flip flop of FIG. 3 is in the ZERO state, the I side output (Q) is low, and the O side output ($\overline{Q}$) is high.

Applying a signal to the data input (D) will cause the output of Q to follow as soon as the rising edge of a clock signal input occurs. Applying a signal to the clear input (CLR) will cause the flip flop to go into the ZERO state.

The clock (CLK) input is an internal trigger which will cause the flip flop to change its state according to the data input (D).

The Reset unit 204 serves simply to synchronize the reset input with the 6 MHz clock signal which is produced by the clock divider of FIG. 3, as which is used by the microprocessor 210 of FIG. 2. The counter 404 guarantees that the synchronous reset (SRESET) has at least a minimum pulse with duration.

Returning to FIG. 2, it is important to understand the philosophy behind the parallel functions of operating with the TACAN host system 100 and the function of programming the EEPROM 250. This philosophy is that the microprocessor 210 can not be operating out of the EEPROM 250 when it is programming the EEPROM. This philosophy is implemented by the configuration of FIG. 2 using the ROM 311, UART communications port 310, mode discrete unit 312, and central data bus 400 as discussed below.

The central data bus 400 of FIG. 2 basically includes only the stat/cont (status/control), data, and address fields. The reset lines are an asynchronous reset (RESET) input and a synchronous reset (SRESET) output. The RESET input is usually a signal from the decoder 203. The decoder 203 usually generates this signal by combining external resets (such as the one from the test equipment that would make the data processing system check for the programming mode), watch-dog timers, power-up resets, etc. depending on the exact configuration required by the host system. The SRESET output is used to synchronously reset the rest of the system (if needed).

The UART 310 connects to the external test equipment. The discretes 312 are used however needed by the host system with the exception of the mode discrete. The mode discrete would probably be controlled by the external test equipment. The interrupts 304 are used however needed by the host system with the exception of one interrupt which is connected to the UART 310.

The address latch 315 serves as both the address demultiplexing latch during normal mode and the windowed address during programming mode. Probably the easiest way to implement this is to have separate demultiplexing latches and window registers connected in parallel via 3-state outputs. The latches would capture the address field using ALE (standard method) and the window registers would be mapped as I/O data locations. These locations would be loaded during programming. Switching between the two modes would be controlled by a bit in an I/O mapped configuration register. The bit would be initialized to the demultiplexing (normal) mode. (NOTE: A second method which could be used if the speed is not too great is to implement only the demultiplexing latches and then control the ALE. The ALE would capture the address during normal mode and, under programming mode, capture the data field when writing to the I/O data location.)

The data buffer 316 operates in three modes. During the initialization and self-test routines, while the bootstrap ROM is enabled, the data buffer constantly outputs the activity of the internal bus. This is for monitoring and testing the internal operation of the data processing system. Since there is no DS signal generated at this time, there are no conflicts on the central data bus. If the data processing system enters the programming mode, the data buffers are disabled except when the window function is specifically accessed. If the data processing system enters the normal mode, the data buffers respond to the normal central data bus 400 activity.

In a typical program and run scenario, the tester would issue a reset. This would reset the CPU 210 and initialize the configuration register to enable the bootstrap ROM, inhibit DS, turn the data buffer 316 to always write, and set the address latch 315 to demultiplex. The tester would set the mode discrete line low and release the reset. The CPU 210 would execute the initialization and self test routines in the bootstrap ROM and then test the mode discrete. In this case, the mode discrete is low. The CPU would proceed into the programming routines. These would first reconfigure the data processing system with the demultiplexing latches disabled, the window registers enabled, and the data buffer 316 and the DS generation mapped to a specific I/O location. The UART and interrupt controller would then be initialized. The data processing system then acts as an intelligent programmer. All programming commands, address, and data are sent via the UART 310. The CPU takes the appropriate addresses and data and maps it onto the central data bus via the window function. NOTE: Not only the EEPROM can be accessed in this manner but any mapped function on the central data bus can also be accessed. This allows for testability of other functions.

Once the EEPROM is programmed (or other functions tested), the tester reasserts the reset and sets the mode line high. The reset line is released and the data processing system repeats the self-tests and again samples the mode line. This time, the line is in the normal mode. The CPU configures the system with the data buffer 316 in normal mode and the address latch 315 in demultiplexing. The CPU simultaneously disenables the bootstrap ROM, enables the DS, and jumps to the external program in the EEPROM. The system then acts normally with the UART being the AGE connection.

The UART communications port 310 and microprocessor 210 are all commercially-available, and need not be described in further detail. For this reason, it is believed that it is abundantly clear from all of the foregoing, and from the contents of the drawings that the stated objects of the instant invention, as well as other objects related thereto, have been achieved.

It is to be noted that, although there have been described and shown the fundamental and unique features of the instant invention, as applied to a preferred embodiment, nevertheless various other embodiments, variations, adaptations, substitutions, additions, and the like may occur to and can be made by those of ordinary skill in the art.

What is claimed is:

1. An EEPROM programming system for use with a host system and an EEPROM, said host system transmitting a first set of data signals to said EEPROM programming system and receiving a set of processed data signals therefrom, said set of processed data signals being generated by said EEPROM, said host system also sending a second set of data signals to said EEPROM programming system to switch said EEPROM programming system to a programming mode where said EEPROM programming system programs said EEPROM as said EEPROM programming system sends a third set of data signals thereto, wherein said host system comprises a TACAN navigation system which outputs TACAN data and a TACAN clock signal, and wherein said EEPROM programming system comprises:

a means for conducting electrical signals, said conducting means being electrically connected with said host system and said EEPROM to conduct said first set of data signals from said host system to said EEPROM, and to conduct said set of processed data signals from said EEPROM to said host system;

a microprocessor which is electrically connected to said conducting means to receive said second set of data signals from said conducting means, said microprocessor outputting a switch signal when receiving said second set of data signals from said conducting means;

a memory means which is electrically connected to said conducting means and said microprocessor, said memory means having stored therein a programming code which forms said third set of data signals which are conducted from said memory means to said EEPROM when the memory means receives said switch signal from said microprocessor;

a communications port which electrically connects said EEPROM directly to said memory means when said switch signal is sent by said microprocessor;

a means for isolating said EEPROM from said conducting means when said switch signal is sent by said microprocessor, said isolation means being electrically connected with said microprocessor and receiving said switch signal therefrom; an internal clock system, which is electrically connected by said conducting means to said TACAN clock signal, wherein said internal clock system outputs an internal clock signal for said microprocessor, and said internal clock system comprises:

a first means for rectifying signals which receives and rectifies said TACAN clock signal to produce an output;

a divide-by-four element which produces an output by receiving and dividing said output from said first rectifying means; and a second means for rectifying signals which outputs an internal clock signal by rectifying the output of said divide-by-four element, said internal clock signal being sent to said microprocessor to serve as a timing signal by which to perform activities with said host system, said EEPROM and said communications port.

* * * * *